United States Patent
Bennett

(10) Patent No.: US 8,350,628 B1
(45) Date of Patent: Jan. 8, 2013

(54) GATE SPEED REGULATOR DITHERING RING OSCILLATOR TO MATCH CRITICAL PATH CIRCUIT

(75) Inventor: George J. Bennett, Murrieta, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 13/027,616

(22) Filed: Feb. 15, 2011

(51) Int. Cl.
*H03K 3/03* (2006.01)

(52) U.S. Cl. .......................................... 331/57; 331/78

(58) Field of Classification Search .................. 331/17, 331/57, 78
See application file for complete search history.

(56) References Cited

U.S. PATENT DOCUMENTS

| | | | |
|---|---|---|---|
| 5,418,499 A | 5/1995 | Nakao | |
| 5,861,780 A | 1/1999 | Fukuda | |
| 6,157,267 A | 12/2000 | Kakimura | |
| 6,658,748 B1 | 12/2003 | Leipold et al. | |
| 6,771,134 B2 * | 8/2004 | Wong et al. | 331/57 |
| 6,963,250 B2 | 11/2005 | Ngo et al. | |
| 7,002,328 B2 | 2/2006 | Kernahan et al. | |
| 7,129,763 B1 | 10/2006 | Bennett et al. | |
| 7,132,895 B2 | 11/2006 | Roth | |
| 7,205,805 B1 | 4/2007 | Bennett | |
| 7,279,995 B2 | 10/2007 | Kernahan et al. | |
| 7,330,019 B1 | 2/2008 | Bennett | |
| 7,356,312 B2 | 4/2008 | Klemmer | |
| 7,486,060 B1 | 2/2009 | Bennett | |
| 7,715,143 B2 | 5/2010 | Bliss et al. | |
| 7,733,149 B2 | 6/2010 | Delage et al. | |
| 7,733,189 B1 | 6/2010 | Bennett | |
| 7,808,328 B2 | 10/2010 | Tatschl-Unterberger et al. | |
| 2007/0069791 A1 | 3/2007 | Chae | |

FOREIGN PATENT DOCUMENTS

WO WO2010083920 7/2010

* cited by examiner

*Primary Examiner* — Levi Gannon

(57) ABSTRACT

A computing device is disclosed comprising digital circuitry including a critical path circuit, and a gate speed regulator. A ring oscillator generates an oscillation frequency, and dither circuitry periodically adjusts a number of inverter elements in the ring oscillator in order to adjust an average propagation delay of the ring oscillator relative to a propagation delay of the critical path circuit. A comparator compares the oscillation frequency to a reference frequency to generate an error signal, and an adjustable circuit, responsive to the error signal, adjusts at least one of a supply voltage and a clocking frequency applied to the digital circuitry.

15 Claims, 3 Drawing Sheets

GATE SPEED REGULATOR DITHERING RING OSCILLATOR TO MATCH CRITICAL PATH CIRCUIT

BACKGROUND

Regulating power consumption of digital circuitry has become an important consideration in designing computing and consumer devices such as desktop and laptop computers, televisions, audio equipment, smartphones, cameras, etc. In portable devices, regulating power consumption helps increase the life of battery power, and in general, regulating power consumption helps reduce operating costs, particularly for large enterprise companies that may continuously operate hundreds or even thousands of computing and storage devices.

FIG. 1A illustrates a prior art gate speed regulator for regulating power consumption of digital circuitry including a critical path circuit 2. A propagation delay oscillator 4 generates a propagation delay frequency 6 representing a propagation delay of the critical path circuit 2. A frequency generator 8 generates a reference frequency 10 and a frequency comparator 12 generates a frequency error 14 representing a difference between the reference frequency 10 and the propagation delay frequency 6. An adjustable circuit 16, responsive to the frequency error 14, adjusts at least one of a supply voltage and a clocking frequency 18 applied to the critical path circuit 2 in order to maintain a target performance and/or a target power consumption.

For example, if the frequency error 14 indicates the propagation delay frequency 6 has fallen bellow a threshold, the adjustable circuit 16 may increase the supply voltage to the digital circuitry to maintain error free operation and performance by maintaining a target propagation delay. Alternatively, the adjustable circuit 16 may decrease the clocking frequency applied to the digital circuitry to maintain error free operation at a lower performance while decreasing the power consumption.

The propagation delay frequency 6 of FIG. 1A may be generated by a ring oscillator shown in FIG. 1B which comprises a plurality of inverters $20_0$-$20_N$ connected in a ring configuration and an NAND gate 22 for enabling the ring oscillator in response to an enable signal 24. The output frequency of the ring oscillator depends on the number of inverters $20_0$-$20_N$, the amplitude of the supply voltage 18, and other factors, such as variations in fabrication process, ambient temperature, etc.

DETAILED DESCRIPTION OF EMBODIMENTS OF THE INVENTION

Figure 1A:
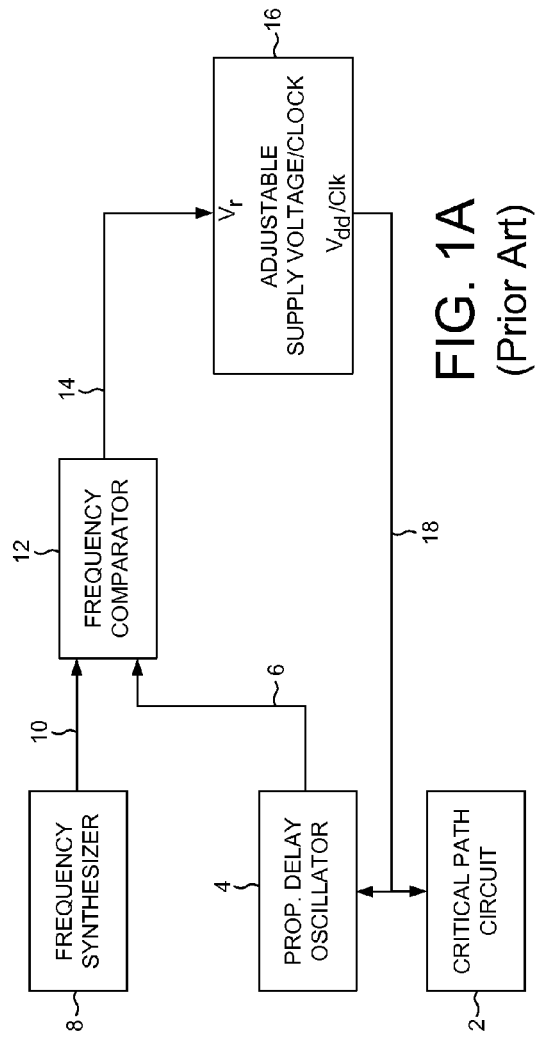
FIG. 1A shows a prior art computing device comprising digital circuitry and a gate speed regulator for regulating power consumption of the digital circuitry.
Figure 1B:
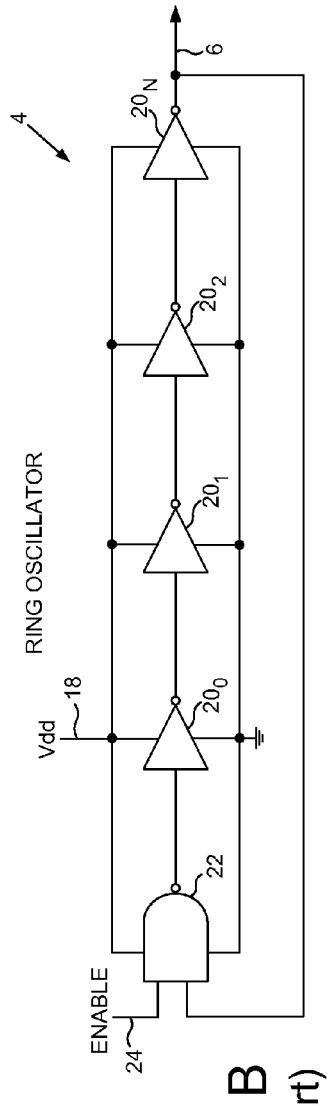
FIG. 1B shows a prior art ring oscillator for generating a propagation delay frequency representing a propagation delay of a critical path circuit in the digital circuitry.
Figure 2:
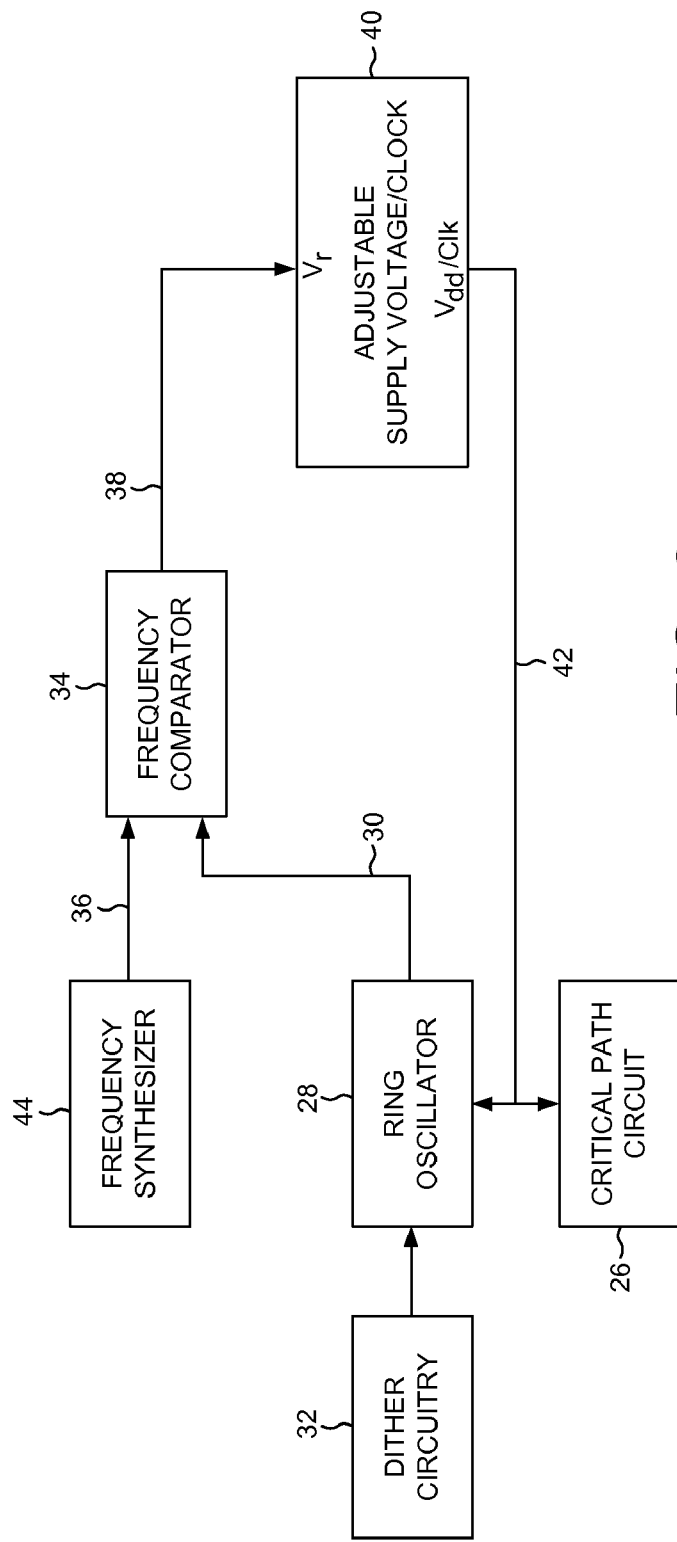
FIG. 2 shows a computing device according to an embodiment of the present invention comprising dither circuitry for periodically adjusting a number of inverter elements in a ring oscillator in order to adjust an average propagation delay of the ring oscillator relative to a propagation delay of a critical path circuit.

FIG. 2 shows a computing device according to an embodiment of the present invention comprising digital circuitry including a critical path circuit 26, and a gate speed regulator. A ring oscillator 28 generates an oscillation frequency 30, and dither circuitry 32 periodically adjusts a number of inverter elements in the ring oscillator 28 in order to adjust an average propagation delay of the ring oscillator 28 relative to a propagation delay of the critical path circuit 26. A comparator 34 compares the oscillation frequency 30 to a reference frequency 36 to generate an error signal 38, and an adjustable circuit 40, responsive to the error signal 38, adjusts at least one of a supply voltage and a clocking frequency 42 applied to the digital circuitry.

In one embodiment, the dither circuitry 32 in FIG. 2 adjusts the number of inverter elements in the ring oscillator 28 so that the average propagation delay of the ring oscillator 28 substantially matches the propagation delay of the critical path circuit 26. In another embodiment, the dither circuitry 32 adjusts the number of inverter elements in the ring oscillator 28 so that the average propagation delay of the ring oscillator 28 substantially matches a multiple or a divisor of the propagation delay of the critical path circuit 26. For example, it may be desirable to design the ring oscillator 28 to have a significantly shorter length to increase the speed of the comparator or to reduce the cost and complexity of the frequency synthesizer 44 and comparator 34 by increasing the oscillation frequency 30 and corresponding reference frequency 36. For example, in one embodiment it may be desirable to have the average propagation delay of the ring oscillator 28 to substantially match ten times the propagation delay of the critical path circuit 26. However, it may not be possible to select a static number of inverter elements for the ring oscillator to achieve the desired ratio of propagation delays. Accordingly, instead of using a ring oscillator having a static number of inverter elements the dither circuitry 32 periodically adjusts the number of inverter elements in the ring oscillator 28 so that the average propagation delay substantially matches a target relative to the propagation delay of the critical path circuit 26.

Figures 3A, 3B:
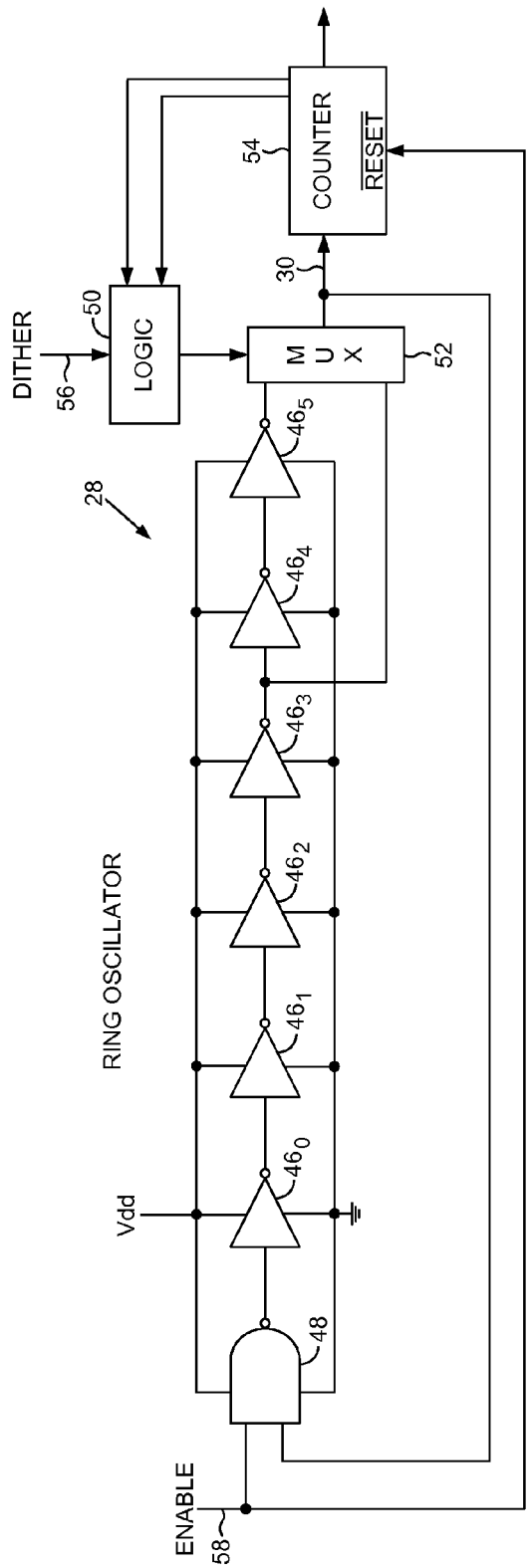
FIG. 3A shows an embodiment of the present invention wherein a multiplexer controlled by a counter periodically removes inverter elements from the ring oscillator.
FIG. 3B illustrates an embodiment of the present invention wherein the least significant bits of the counter cycle through four states for configuring the number of inverter elements in the ring oscillator based on a dither mode.

Any suitable dither circuitry 32 may be employed in the embodiments of the present invention in order to adjust the number of inverter elements in the ring oscillator 28. FIG. 3A shows an embodiment of the present invention wherein the ring oscillator 28 comprises six inverter elements $46_0$-$46_5$ and a NAND gate 48 for enabling the ring oscillator 28. Logic circuitry 50 periodically configures a multiplexer 52 to selectively remove two of the inverter elements $46_4$ and $46_5$ from the ring oscillator 28. In one embodiment, the logic circuitry 50 removes the two inverter elements $46_4$ and $46_5$ for a predetermined number of cycles of the oscillation frequency 30 (e.g., remove the two inverter elements $46_4$ and $46_5$ every N out of M cycles).

In the embodiment of FIG. 3A, the oscillation frequency 30 drives a counter 54 wherein the two least significant bits (LSBs) of the counter 54 cycle through four states and the logic circuitry 50 configures the multiplexer 52 based on the state of the two LSBs. The number of cycles that the two inverter elements $46_4$ and $46_5$ are removed from the ring oscillator 28 is configurable based on a dither control signal 56. FIG. 3B shows a table according to an embodiment of the present invention comprising a number of rows each corresponding to a different dither mode (as configured by the dither control signal 56), and four columns corresponding to the four states of the counter LSBs. For dither mode one the two inverter elements $46_4$ and $46_5$ are removed one out of four cycles, for dither mode two the two inverter elements $46_4$ and $46_5$ are removed two out of four cycles, and so on.

In one embodiment, an enable signal 58 in FIG. 3A disables the ring oscillator 28 and resets the counter 54 at the beginning of a comparison interval. The enable signal 58 then synchronously enables the ring oscillator 28 and the counter 54 for a number of cycles. In one embodiment, the comparison interval may comprise an integer multiple of the number of states shown in FIG. 3B. For example, the comparison interval may comprise 4, 8, 16, or other suitable multiple of four cycles. At the end of the comparison interval, the output of the counter 54 is compared to the output of a counter driven by the frequency synthesizer 44 (FIG. 2) in order to compare the oscillation frequency 30 to the reference frequency 36. Other embodiments may achieve a fractional propagation delay by having the comparison interval include at least one fraction of four cycles (as long as each subsequent comparison interval comprises the same cycle sequence).

Dithering the ring oscillator 28 results in an oscillation frequency 30 that represents an average propagation delay of the ring oscillator 28. For example, for dither mode two of FIG. 3B, two inverter elements $46_4$ and $46_5$ are removed two out of four cycles so that there are five inverting elements for two cycles and seven inverting elements for two cycles for an average of six inverting elements over the comparison interval and a corresponding average propagation delay over the comparison interval.

In other embodiments, the logic circuitry 50 may configure the multiplexer 52 to remove the two inverting elements $46_4$ and $46_5$ based on different sequences, such as every other cycle, or at a cycle ratio that varies over time. In other embodiments, the logic circuitry 50 may evaluate more significant bits of the counter 54 to change the resolution of the states, and/or additional bits in order to increase the number of states. In yet other embodiments, the multiplexer 52 may be configured to selectively remove a different number of inverter elements based on the state. For example, the logic circuitry 50 may configure the multiplexer 52 to remove two inverter elements during a first state, and then remove four inverter elements during a second state. In other embodiments, the dither mode may be periodically adjusted by periodically adjusting the dither control signal 56 so that inverter elements are periodically removed from the ring oscillator 28 based on a ratio that varies over time.

In one embodiment, the dither mode may be adapted in order to tune the average propagation delay of the ring oscillator 28 until a desired criteria is met. For example, the dither mode may be adjusted to adjust the average propagation delay of the ring oscillator 28 until a desired performance is maintained while attempting to minimize the power consumption. In other words, rather than attempting to estimate the dither mode that will establish a desired average propagation delay, the dither mode is adjusted until a desired performance and power consumption is achieved.

In another embodiment, the dither mode of the ring oscillator 28 may be configured based on an operating mode of the computing device, and a corresponding change in the critical path circuit 26. That is, rather than provide multiple ring oscillators corresponding to different critical path circuits, in one embodiment the dither mode of a single ring oscillator may be adjusted in order to change the average propagation delay relative to a particular critical path circuit that may be active.

The adjustable circuit 40 of FIG. 2 may comprise any suitable circuitry for adjusting at least one of the supply voltage or clocking frequency applied to the digital circuitry in response to the error signal 38. For example, in one embodiment the adjustable circuit 40 may comprise a suitable switched-mode regulator for regulating the supply voltage by periodically charging a suitable charging element such as an inductor. In another embodiment, the adjustable circuit 40 may comprise suitable circuitry for adjusting a clocking frequency applied to the digital circuitry, such as with a programmable frequency synthesizer or phase-locked loop (PLL).

What is claimed is:

1. A computing device comprising:
   digital circuitry comprising a critical path circuit; and
   a gate speed regulator comprising:
      a ring oscillator operable to generate an oscillation frequency;
      dither circuitry operable to periodically adjust a number of inverter elements in the ring oscillator over a number of cycles in order to adjust an average propagation delay of the ring oscillator relative to a propagation delay of the critical path circuit;
      a comparator operable to compare the oscillation frequency to a reference frequency to generate an error signal; and
      an adjustable circuit, responsive to the error signal, for adjusting at least one of a supply voltage and a clocking frequency applied to the digital circuitry.

2. The computing device as recited in claim 1, wherein the dither circuitry is operable to adjust the average propagation delay of the ring oscillator to substantially match a multiple of the propagation delay of the critical path circuit.

3. The computing device as recited in claim 1, wherein the dither circuitry is operable to adjust the average propagation delay of the ring oscillator to substantially match a divisor of the propagation delay of the critical path circuit.

4. The computing device as recited in claim 1, wherein the dither circuitry comprises a multiplexer operable to selectively remove at least one inverter element from the ring oscillator.

5. The computing device as recited in claim 4, wherein the multiplexer is operable to selectively remove two inverter elements from the ring oscillator.

6. The computing device as recited in claim 4, wherein the dither circuitry periodically configures the multiplexer.

7. The computing device as recited in claim 6, wherein the dither circuitry comprises a counter for periodically configuring the multiplexer.

8. The computing device as recited in claim 7, wherein the oscillation frequency is operable to drive the counter.

9. A method of operating a computing device comprising digital circuitry comprising a critical path circuit, the method comprising:
   using a ring oscillator to generate an oscillation frequency;
   periodically adjusting a number of inverter elements in the ring oscillator over a number of cycles in order to adjust an average propagation delay of the ring oscillator relative to a propagation delay of the critical path circuit;
   comparing the oscillation frequency to a reference frequency to generate an error signal; and
   adjusting at least one of a supply voltage and a clocking frequency applied to the digital circuitry in response to the error signal.

10. The method as recited in claim 9, further comprising adjusting the average propagation delay of the ring oscillator to substantially match a multiple of the propagation delay of the critical path circuit.

11. The method as recited in claim 9, further comprising adjusting the average propagation delay of the ring oscillator to substantially match a divisor of the propagation delay of the critical path circuit.

12. The method as recited in claim 9, further comprising removing at least one inverter element from the ring oscillator.

13. The method as recited in claim 12, further comprising periodically removing two inverter elements from the ring oscillator.

14. The method as recited in claim 12, further comprising using a counter to periodically remove at least one inverter element from the ring oscillator.

15. The method as recited in claim 14, further comprising driving the counter with the oscillation frequency.

* * * * *